(12) United States Patent
Rinerson et al.

(10) Patent No.: US 9,159,913 B2
(45) Date of Patent: Oct. 13, 2015

(54) TWO-TERMINAL REVERSIBLY SWITCHABLE MEMORY DEVICE

(71) Applicant: Unity Semiconductor Corporation, Sunnyvale, CA (US)

(72) Inventors: Darrell Rinerson, Cupertino, CA (US); Christophe J. Chevallier, Palo Alto, CA (US); Wayne Kinney, Emmett, ID (US); Roy Lambertson, Los Altos, CA (US); John E. Sanchez, Jr., Palo Alto, CA (US); Lawrence Schloss, Palo Alto, CA (US); Philip Swab, Santa Rosa, CA (US); Edmond Ward, Monte Sereno, CA (US)

(73) Assignee: Unity Semiconductor Corporation, Sunnyvale, CA (US)

( * ) Notice: Subject to any disclaimer, the term of this patent is extended or adjusted under 35 U.S.C. 154(b) by 0 days.

(21) Appl. No.: 14/463,518

(22) Filed: Aug. 19, 2014

(65) Prior Publication Data
US 2015/0029780 A1    Jan. 29, 2015

Related U.S. Application Data

(63) Continuation of application No. 12/456,627, filed on Jun. 18, 2009, now abandoned, which is a continuation of application No. 11/095,026, filed on Mar. 30, 2005, now abandoned, which is a continuation-in-part of (Continued)

(51) Int. Cl.
*H01L 45/00* (2006.01)
*G06F 17/50* (2006.01)
(Continued)

(52) U.S. Cl.
CPC .......... *H01L 45/085* (2013.01); *G06F 17/5045* (2013.01); *G11C 11/5685* (2013.01); *G11C 13/004* (2013.01); *G11C 13/0007* (2013.01); *G11C 13/0009* (2013.01);
(Continued)

(58) Field of Classification Search
CPC .................. H01L 45/1233; H01L 45/147
USPC .................. 257/321, 536, E45.003; 365/148
See application file for complete search history.

(56) References Cited

U.S. PATENT DOCUMENTS

| 3,886,577 A | 5/1975 | Buckley |
| 5,296,716 A | 3/1994 | Ovshinsky et al. |

(Continued)

FOREIGN PATENT DOCUMENTS

| EP | 1376598 A1 | 1/2004 |
| EP | 1376598 B1 | 1/2004 |

(Continued)

OTHER PUBLICATIONS

Abelmann et al., "Self-Assembled Three-Dimensional Non-Volatile Memories," Micromachines 2010, vol. 1, pp. 1-18, Jan. 18, 2010. 18 pages.

(Continued)

*Primary Examiner* — Jerome Jackson, Jr.
*Assistant Examiner* — Bo Fan
(74) *Attorney, Agent, or Firm* — Stolowitz Ford Cowger LLP

(57) ABSTRACT

A memory using mixed valence conductive oxides is disclosed. The memory includes a mixed valence conductive oxide that is less conductive in its oxygen deficient state and a mixed electronic ionic conductor that is an electrolyte to oxygen and promotes an electric field effective to cause oxygen ionic motion.

20 Claims, 9 Drawing Sheets

Related U.S. Application Data application No. 10/934,951, filed on Sep. 3, 2004, now Pat. No. 7,538,338, and a continuation-in-part of application No. 10/773,549, filed on Feb. 6, 2004, now Pat. No. 7,082,052.

(51) Int. Cl.
*G11C 11/56* (2006.01)
*G11C 13/00* (2006.01)
*H01L 27/24* (2006.01)

(52) U.S. Cl.
CPC ....... *G11C 13/0069* (2013.01); *H01L 27/2436* (2013.01); *H01L 27/2481* (2013.01); *H01L 45/08* (2013.01); *H01L 45/1233* (2013.01); *H01L 45/1253* (2013.01); *H01L 45/146* (2013.01); *H01L 45/147* (2013.01); *H01L 45/1625* (2013.01); *G11C 2013/005* (2013.01); *G11C 2013/009* (2013.01); *G11C 2013/0045* (2013.01); *G11C 2213/11* (2013.01); *G11C 2213/31* (2013.01); *G11C 2213/32* (2013.01); *G11C 2213/53* (2013.01); *G11C 2213/54* (2013.01); *G11C 2213/56* (2013.01); *G11C 2213/71* (2013.01); *G11C 2213/79* (2013.01)

(56) References Cited

U.S. PATENT DOCUMENTS

| | | | |
|---|---|---|---|
| 5,483,482 A | 1/1996 | Yamada et al. |
| 5,625,587 A | 4/1997 | Peng et al. |
| 5,835,396 A | 11/1998 | Zhang |
| 5,894,135 A | 4/1999 | Yamamoto et al. |
| 5,991,193 A | 11/1999 | Gallagher et al. |
| 6,034,882 A | 3/2000 | Johnson et al. |
| 6,128,214 A | 10/2000 | Kuekes et al. |
| 6,185,121 B1 | 2/2001 | O'Neill |
| 6,185,122 B1 | 2/2001 | Johnson et al. |
| 6,204,139 B1 | 3/2001 | Liu et al. |
| 6,259,644 B1 | 7/2001 | Tran et al. |
| 6,351,406 B1 | 2/2002 | Johnson et al. |
| 6,385,074 B1 | 5/2002 | Johnson et al. |
| 6,407,953 B1 | 6/2002 | Cleeves |
| 6,420,215 B1 | 7/2002 | Knall et al. |
| 6,458,621 B1 | 10/2002 | Beck |
| 6,459,095 B1 | 10/2002 | Heath et al. |
| 6,473,332 B1 | 10/2002 | Ignatiev et al. |
| 6,487,106 B1 | 11/2002 | Kozicki |
| 6,504,753 B1 | 1/2003 | Scheuerlein et al. |
| 6,515,888 B2 | 2/2003 | Johnson et al. |
| 6,515,904 B2 | 2/2003 | Moore et al. |
| 6,522,594 B1 | 2/2003 | Scheuerlein |
| 6,525,953 B1 | 2/2003 | Johnson |
| 6,531,371 B2 | 3/2003 | Hsu et al. |
| 6,534,403 B2 | 3/2003 | Cleeves |
| 6,545,891 B1 | 4/2003 | Tringali et al. |
| 6,569,745 B2 | 5/2003 | Hsu |
| 6,599,796 B2 | 7/2003 | Mei et al. |
| 6,631,085 B2 | 10/2003 | Kleveland et al. |
| 6,635,603 B1 | 10/2003 | Batlogg et al. |
| 6,642,539 B2 | 11/2003 | Ramest et al. |
| 6,657,888 B1 | 12/2003 | Doudin et al. |
| 6,693,821 B2 | 2/2004 | Hsu et al. |
| 6,731,528 B2 | 5/2004 | Hush et al. |
| 6,753,561 B1 | 6/2004 | Rinerson et al. |
| 6,759,249 B2 | 7/2004 | Zhuang et al. |
| 6,774,054 B1 * | 8/2004 | Zhang et al. .................. 438/781 |
| 6,777,248 B1 | 8/2004 | Nabatame et al. |
| 6,788,576 B2 | 9/2004 | Roizin |
| 6,807,088 B2 | 10/2004 | Tsuchida |
| 6,816,410 B2 | 11/2004 | Kleveland et al. |
| 6,822,903 B2 | 11/2004 | Scheuerlein et al. |
| 6,825,489 B2 | 11/2004 | Kozicki |
| 6,834,013 B2 | 12/2004 | Fan et al. |
| 6,836,421 B2 | 12/2004 | Rinerson et al. |
| 6,839,269 B2 | 1/2005 | Iwata et al. |
| 6,850,455 B2 | 2/2005 | Rinerson et al. |
| 6,855,647 B2 | 2/2005 | Beck et al. |
| 6,856,536 B2 | 2/2005 | Rinerson et al. |
| 6,859,382 B2 | 2/2005 | Rinerson et al. |
| 6,882,553 B2 | 4/2005 | Nejad et al. |
| 6,903,361 B2 | 6/2005 | Gilton |
| 6,917,539 B2 | 7/2005 | Rinerson et al. |
| 6,927,430 B2 | 8/2005 | Hsu |
| 6,937,505 B2 | 8/2005 | Morikawa |
| 6,939,724 B2 | 9/2005 | Zhuang et al. |
| 6,940,113 B2 | 9/2005 | Hsu et al. |
| 6,940,744 B2 | 9/2005 | Rinerson et al. |
| 6,965,137 B2 | 11/2005 | Kinney et al. |
| 6,970,375 B2 | 11/2005 | Rinerson et al. |
| 6,972,427 B2 | 12/2005 | Roehr et al. |
| 6,985,378 B2 | 1/2006 | Kozicki |
| 6,998,698 B2 | 2/2006 | Inoue et al. |
| 7,001,846 B2 | 2/2006 | Hsu |
| 7,002,197 B2 | 2/2006 | Perner et al. |
| 7,005,717 B2 | 2/2006 | Eisenbeiser et al. |
| 7,009,909 B2 | 3/2006 | Rinerson et al. |
| 7,020,006 B2 | 3/2006 | Chevallier et al. |
| 7,022,572 B2 | 4/2006 | Scheuerlein et al. |
| 7,023,743 B2 | 4/2006 | Nejad et al. |
| 7,029,924 B2 | 4/2006 | Hsu et al. |
| 7,046,550 B1 | 5/2006 | Reohr et al. |
| 7,057,914 B2 | 6/2006 | Rinerson et al. |
| 7,060,586 B2 | 6/2006 | Li et al. |
| 7,079,442 B2 | 7/2006 | Rinerson et al. |
| 7,141,481 B2 | 11/2006 | Hsu et al. |
| 7,148,533 B2 | 12/2006 | Hsu et al. |
| 7,177,181 B1 | 2/2007 | Scheuerlein |
| 7,256,415 B2 | 8/2007 | Furukawa et al. |
| 7,292,957 B1 | 11/2007 | Schell |
| 7,326,979 B2 | 2/2008 | Rinerson et al. |
| 7,339,811 B2 | 3/2008 | Nejad et al. |
| 7,372,753 B1 | 5/2008 | Rinerson et al. |
| 7,379,364 B2 | 5/2008 | Siau et al. |
| 7,394,680 B2 | 7/2008 | Toda et al. |
| 7,405,960 B2 | 7/2008 | Cho et al. |
| 7,408,212 B1 | 8/2008 | Luan et al. |
| 7,411,811 B2 | 8/2008 | Inoue |
| 7,417,271 B2 | 8/2008 | Genrikh et al. |
| 7,443,711 B1 | 10/2008 | Stewart et al. |
| 7,460,385 B2 | 12/2008 | Gruber et al. |
| 7,463,546 B2 | 12/2008 | Fasoli et al. |
| 7,498,600 B2 | 3/2009 | Cho et al. |
| 7,505,344 B2 | 3/2009 | Scheuerlein |
| 7,508,695 B2 | 3/2009 | Sugita |
| 7,538,338 B2 | 5/2009 | Rinerson et al. |
| 7,554,873 B2 | 6/2009 | Lee et al. |
| 7,608,467 B2 | 10/2009 | Wu et al. |
| 7,639,521 B2 | 12/2009 | Baek et al. |
| 7,643,344 B2 | 1/2010 | Choi |
| 7,701,791 B2 | 4/2010 | Rinerson et al. |
| 7,706,177 B2 | 4/2010 | Petti |
| 7,719,876 B2 | 5/2010 | Chevallier et al. |
| 7,733,685 B2 | 6/2010 | Scheuerlein et al. |
| 7,742,323 B2 | 6/2010 | Rinerson et al. |
| 7,782,650 B2 | 8/2010 | Bertin et al. |
| 7,842,991 B2 | 11/2010 | Cho et al. |
| 7,884,349 B2 | 2/2011 | Rinerson et al. |
| 7,898,841 B2 | 3/2011 | Chevallier et al. |
| 7,902,867 B2 | 3/2011 | Mouttet |
| 7,902,868 B2 | 3/2011 | Norman |
| 7,902,869 B1 | 3/2011 | Carter |
| 7,924,608 B2 | 4/2011 | Campbell |
| 7,929,345 B2 | 4/2011 | Issaq |
| 7,955,871 B2 | 6/2011 | Wu et al. |
| 7,961,494 B2 | 6/2011 | Scheuerlein |
| 7,983,065 B2 | 7/2011 | Samachisa |
| 7,985,963 B2 | 7/2011 | Rinerson et al. |
| 8,139,409 B2 | 3/2012 | Chevallier et al. |
| 2001/0055838 A1 | 12/2001 | Walker et al. |
| 2003/0003675 A1 | 1/2003 | Hsu |
| 2003/0132456 A1 | 7/2003 | Miyai et al. |
| 2003/0137869 A1 | 7/2003 | Kozicki |

(56) References Cited

U.S. PATENT DOCUMENTS

| | | |
|---|---|---|
| 2003/0151959 A1 | 8/2003 | Tringali et al. |
| 2004/0109353 A1 | 6/2004 | Matsuoka |
| 2004/0141369 A1 | 7/2004 | Noguchi |
| 2004/0159828 A1 | 8/2004 | Rinerson et al. |
| 2004/0159867 A1 | 8/2004 | Kinney et al. |
| 2004/0159868 A1 | 8/2004 | Rinerson et al. |
| 2004/0161888 A1 | 8/2004 | Rinerson et al. |
| 2004/0170040 A1 | 9/2004 | Rinerson et al. |
| 2005/0135148 A1 | 6/2005 | Chevallier et al. |
| 2005/0151156 A1* | 7/2005 | Wu et al. ............... 257/107 |
| 2005/0269626 A1 | 12/2005 | Forbes |
| 2006/0023497 A1 | 2/2006 | Kawazoe et al. |
| 2006/0050598 A1 | 3/2006 | Rinerson et al. |
| 2006/0054937 A1 | 3/2006 | Lucovsky et al. |
| 2006/0131695 A1 | 6/2006 | Kuekes et al. |
| 2006/0171200 A1 | 8/2006 | Rinerson et al. |
| 2007/0223282 A1 | 9/2007 | Sarig |
| 2007/0253245 A1 | 11/2007 | Ranjan et al. |
| 2008/0068875 A1 | 3/2008 | Choi |
| 2008/0079029 A1 | 4/2008 | Williams |
| 2008/0090337 A1 | 4/2008 | Williams |
| 2008/0090401 A1 | 4/2008 | Bratkovski et al. |
| 2008/0157127 A1 | 7/2008 | Bertin et al. |
| 2008/0173975 A1 | 7/2008 | Chen et al. |
| 2008/0278989 A1 | 11/2008 | Lee et al. |
| 2009/0027976 A1 | 1/2009 | Rinerson et al. |
| 2009/0154232 A1 | 6/2009 | Norman |
| 2009/0225582 A1 | 9/2009 | Schloss |
| 2009/0302315 A1 | 12/2009 | Lee et al. |
| 2009/0303772 A1 | 12/2009 | Rinerson et al. |
| 2009/0303773 A1 | 12/2009 | Rinerson et al. |
| 2010/0044666 A1 | 2/2010 | Baek et al. |
| 2010/0067279 A1 | 3/2010 | Choi |
| 2010/0073990 A1 | 3/2010 | Siau et al. |
| 2010/0078759 A1 | 4/2010 | Sekar et al. |
| 2010/0103724 A1 | 4/2010 | Kim et al. |
| 2010/0110771 A1 | 5/2010 | Choi |
| 2010/0134239 A1 | 6/2010 | Wu et al. |
| 2010/0155686 A1 | 6/2010 | Bratkovski et al. |
| 2010/0155722 A1 | 6/2010 | Meyer |
| 2010/0155953 A1 | 6/2010 | Bornstein |
| 2010/0157658 A1 | 6/2010 | Schloss et al. |
| 2010/0159641 A1 | 6/2010 | Rinerson et al. |
| 2010/0159688 A1 | 6/2010 | Rinerson et al. |
| 2010/0161888 A1 | 6/2010 | Eggleston |
| 2010/0161918 A1 | 6/2010 | Norman |
| 2010/0195393 A1 | 8/2010 | Eggleston |
| 2010/0202188 A1 | 8/2010 | Rinerson et al. |
| 2010/0271885 A1 | 10/2010 | Scheuerlein et al. |
| 2010/0278479 A1 | 11/2010 | Bratkovski et al. |
| 2010/0290294 A1 | 11/2010 | Siau |
| 2011/0006275 A1 | 1/2011 | Roelofs et al. |
| 2011/0017977 A1 | 1/2011 | Bratkovski et al. |
| 2011/0024710 A1 | 2/2011 | Bratkovski et al. |
| 2011/0024716 A1 | 2/2011 | Bratkovski et al. |
| 2011/0059576 A1 | 3/2011 | Cho et al. |
| 2011/0182103 A1 | 7/2011 | Smythe et al. |
| 2011/0188281 A1 | 8/2011 | Siau et al. |
| 2011/0188282 A1 | 8/2011 | Chevallier et al. |
| 2011/0188283 A1 | 8/2011 | Chevallier et al. |
| 2011/0188284 A1 | 8/2011 | Chevallier et al. |
| 2011/0297927 A1 | 12/2011 | Ramaswamy et al. |
| 2012/0012897 A1 | 1/2012 | Besser et al. |
| 2012/0087174 A1 | 4/2012 | Rinerson et al. |

FOREIGN PATENT DOCUMENTS

| | | |
|---|---|---|
| WO | WO-2005-117021 | 12/2005 |
| WO | WO-2006-029228 | 3/2006 |

OTHER PUBLICATIONS

Baek et al., "Realization of Vertical Resistive Memory (VRRAM) Using Cost Effective 3D Process," IDEM 2011, vol. 31, No. 8.1, pp. 737-740. 4 pages.

Baikalov et al., "Field-Driven Hysteretic and Reversible Resistive Switch at the Ag—Pr0.7Ca0.3MnO3 Interface," Applied Physics Letters, vol. 83, No. 5, Aug. 4, 2003, pp. 957-959. 3 pages.

Bateman, Bruce, U.S. Appl. No. 13/210,292, filed Aug. 15, 2011, re Filed Application with Figures. 88 pages.

Beck et al., "Reproducible Switching Effect in Thin Oxide Films for Memory Applications," Applied Physics Letters, vol. 77, No. 1, Jul. 3, 2000, pp. 139-141. 3 pages.

Brewer, Julie, U.S. Appl. No. 13/210,342, filed Aug. 15, 2011, re Filed Application and Figures. 81 pages.

Chevallier et al., "A 0.13um 64Mb Multi-Layered Conductive Metal-Oxide Memory," ISSCC 2010/ Session 14/ Non-Volatile Memory/ 14.3, pp. 260-261. 2 pages.

Crowley et al., "16.4: 512Mb PROM with 8 Layers of Antifuse/Diode Cells," 2003 IEEE ISSCC, First Edition, pp. 284-285, 493, Feb. 11, 2003. 10 pages.

Dong et al., "Si/a-Si Core/Shell Nanowires as Nonvolatile Crossbar Switches," Nano Letters 2008, vol. 8, No. 2, pp. 861-391. 6 pages.

EP Office Action dated Aug. 2, 2007 in EP Application No. 05 794 930.7. 4 pages.

International Search Report and Written Opinion dated Aug. 15, 2006 re International Application No. PCT/US05/031913. 14 pages.

Simmons et al., "New Conduction and Reversible Memory Phenomena in Thin Insulating Films," Proc. Roy. Soc. A. 301, 1967, pp. 77-102. 28 pages.

Jang et al., "Vertical Cell Array using TCAT (Terabit Cell Array Transistor) Technology for Ultra High Density NAND Flash Memory," 2009 Symposium on VLSI Technology Digest of Technical Papers, pp. 192-193. 2 pages.

JP Response dated Aug. 7, 2012 re JP Application No. 2007-530487. 9 pages.

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137. 2 pages.

Kim et al., "Novel Vertical-Stacked-Array-Transistor (VSAT) for Ultra-High-Density and Cost-Effective NAND Flash Memory Devices and SSD (Solid State Drive)," 2009 Symposium on VLSI Technology Digest of Technical Papers, pp. 186-187. 2 pages.

Kim et al., "Multi-Layered Vertical Gate NAND Flash Overcoming Stacking Limit for Terabit Density Storage," 2009 VLSI Symposium on VLSI Technology Digest of Technical Papers, Jun. 16-18, 2009, pp. 188-189. 2 pages.

Krieger, Ju H., "Principle Operation of 3-D Memory Device based on Piezoacousto Properties of Ferroelectric Films," InTech, Dec. 2010, pp. 3-16. 14 pages.

Kwong et al., "Vertical Silicon Nanowire Platform for Low Power Electronics and Clean Energy Applications," May 25, 2011, Journal of Nanotechnology, vol. 2012, Article ID 492121. 21 pages.

Lai et al., "OUM—A 180 nm Nonvolatile Memory Cell Element Technology for Stand Alone and Embedded Applications," IEEE International Electron Device Meeting, Technical Digest, vol. 803, 2001. 4 pages.

Lee et al., "Near Edge X-ray Absorption Fine Structure Study of Pr0.65Ca0.35MnO3 Films", Phys. Stat. sol (a), vol. 196, No. 1, 2003, pp. 70-73. 4 pages.

Liu et al., "A New Concept for Non-Volatile Memory: The Electric-Pulse Induced Resistive Change Effect in Colossal Magnetoresistive Thin Films," Non-Volatile Memory Technology Symposium, Nov. 7, 2001, pp. 1-7. 7 pages.

Liu et al., "Electric-Pulse-Induced Reversible Resistance Change Effect in Magnetoresistive Films," Applied Physics Letters, vol. 76, No. 19, May 8, 2000, pp. 2749-2751. 3 pages.

Lue et al., "A Highly Scalable 8-Layer 3D Vertical-Gate (VG) TFT NAND Flash Using Junction-Free Buried Channel BE-SONOS Device," 2010 Symposium on VLSI Technology, Jun. 15-17, 2010, pp. 131-132. 2 pages.

Millis, A.J., "Cooperative Jahn-Teller Effect and Electron-Phonon Coupling in La1-xAxMnO3," Phys. Rev. B 53, pp. 8434-8441, 1996. 8 pages.

Mizusaki et al., "Electronic Conductivity, Seebeck Coefficient, Defect and Electronic Structure of Nonstoichiometric La1-xSRxMnO3," Solid State Ionics 132, pp. 167-180, 2000. 14 pages.

(56) References Cited

OTHER PUBLICATIONS

Nian et al., "Evidence for an Oxygen Diffusion Model for the Electric Pulse Induced Resistance Change Effect in Oxides," Texas Center for Advanced Materials, University of Houston, TX, 2006. 7 pages.

Oligschlaeger et al., "Resistive Switching and Data Reliability of Epitaxial (Ba,Sr) TiO Thin Films," Applied Physics Letters, vol. 88, 2006. 3 pages.

Ou et al., "Array Architecture for a Nonvolatile 3-Dimensional Cross-Point Memory," Doctoral Dissertation, Stanford University, Mar. 2010, pp. 1-119. 119 pages.

Ou et al., "Array Architecture for a Nonvolatile 3-Dimensional Cross-Point Resistance-Change Memory," IEEE Journal of Solid-State Circuits, vol. 46, No. 9, Sep. 2011, pp. 2158-2170. 13 pages.

Oxley, David, "Chapter 4: Memory Effects in Oxide Films," pp. 251-325 in Oxides and Oxide Films, vol. 6, 1981, edited by Ashok K. Vijh. 39 pages.

Parrillo, Louis, U.S. Appl. No. 13/250,772, filed Sep. 30, 2011, re Filed Application with Figures. 63 pages.

PCT International Preliminary Report on Patentability dated Aug. 28, 2007 in International Application No. PCT/US2005/031913. 5 pages.

PCT International Search Report dated Feb. 14, 2006 in International Application No. PCT/US2005/031913. 6 pages.

PCT Written Opinion dated Sep. 3, 2004 in International Application No. PCT/US2005/031913. 7 pages.

Reller et al., "Superstructures Formed by the Ordering of Vacancies in a Selective Oxidation Catalyst: Grossly Defective CaMnO3," Proceedings of the Royal Society of London, vol. 394, No. 1807, Aug. 1984, pp. 223-241. 26 pages.

Reller et al., "Superstructures Formed by the Ordering of Vacancies in a Selective Oxidation Catalyst: Grossly Defective CaMn03," Printed in Great Britain, Department of Physical Chemistry, University of Cambridge, Lensfield Road, Cambridge, CB2 1EP, U.K., Received Dec. 29, 1983, vol. 194, Aug. 8, 1984. 1 page.

Rinerson, Darrell, U.S. Appl. No. 10/985,218, filed Jan. 12, 2004, re U.S. Appl. No. 60/536,115, filed Jan. 13, 2004. 9 pages.

Rossel et al., "Electrical Current Distribution Across a Metal-Insulator-Metal Structure During Bistable Switching," Journal of Applied Physics, vol. 90, No. 6, Sep. 15, 2001, pp. 2892-2898. 7 pages.

Sawa et al., "Hysteretic Current-Voltage Characteristics and Resistance Switching at a Rectifying Ti/Pr0.7Ca0.3MnO3 Interface," Applied Physics Letters, vol. 85, No. 18, Nov. 1, 2004, pp. 4073-4075. 3 pages.

Siau, Chang, U.S. Appl. No. 13/134,579, filed Jun. 10, 2011, re Filed Application with Figures. 64 pages.

Steele et al., "Materials for Fuel-Cell Technologies," Nature 414, Nov. 2001, pp. 345-352. 9 pages.

Stetter et al., "Sensors, Chemical Sensors, Electrochemical Sensors, and ECS," Journal of the Electrochemical Society, vol. 150, No. 2, S11-S16, 2003. 6 pages.

Strachan et al., "The Switching Location of a Bipolar Memristor: Chemical, Thermal and Structural Mapping," Nanotechnology 22, 2011, pp. 1-6. 7 pages.

Thurstans et al., "The Electroformed Metal-Insulator-Metal Structure: A Comprehensive Model," Journal of Physics D: Applied Physics, vol. 35, Apr. 2, 2002, pp. 802-809. 8 pages.

Watanabe et al., "Current-Driven Insulator-Conductor Transition and Nonvolatile Memory in Chromium-Doped SrTiO3 Single Crystals," Applied Physics Letters, vol. 78, No. 23, Jun. 4, 2001, pp. 3738-3740. 3 pages.

Wu, Jian, U.S. Appl. No. 13/250,923, filed Sep. 30, 2011, re Filed Application with Figures. 44 pages.

Yoon et al., "Vertical Cross-Point Resistance Change Memory for Ultra-High Density Non-volatile Memory Applications," 2009 Symposium on VLSI Technology Digest of Technical Papers, pp. 26-27. 2 pages.

Zhang et al., "A 3D RRAM Using Stackable 1TXR Memory Cell for High Density Application," IEEE Xplore, Feb. 5, 2010, pp. 917-920. 4 pages.

Zhao et al., "Effect of Oxygen Content on the Structural, Transport, and Magnetic Properties of La1-deltaMn1-deltaO3 Thin Films," Journal of Applied Physics, vol. 86, No. 11, Dec. 1999, pp. 6327-6330. 4 pages.

Zhuang et al., "Novell Colossal Magnetoresistive Thin Film Nonvolatile Resistance Random Access Memory (RRAM)," IEDM Technical Digest, IEEE, Dec. 8, 2002, pp. 193-196. 4 pages.

* cited by examiner

TWO-TERMINAL REVERSIBLY SWITCHABLE MEMORY DEVICE

CROSS-REFERENCE TO RELATED APPLICATIONS

This application is a continuation of U.S. patent application Ser. No. 12/456,627, filed Jun. 18, 2009, now abandoned, which is a continuation of U.S. patent application Ser. No. 11/095,026, filed Mar. 30, 2005, now abandoned, which is a continuation-in-part of U.S. patent application Ser. No. 10/934,951, filed Sep. 3, 2004, which issued on May 26, 2009 as U.S. Pat. No. 7,538,338, and which is a continuation-in-part of U.S. patent application Ser. No. 10/773,549, filed Feb. 6, 2004, which issued on Jul. 25, 2006 as U.S. Pat. No. 7,082,052.

BACKGROUND OF THE INVENTION

1. Field of the Invention

The present invention relates to computer memory and more specifically to non-volatile memory.

2. Description of the Related Art

Memory can either be classified as volatile or nonvolatile. Volatile memory is memory that loses its contents when the power is turned off. In contrast, non-volatile memory does not require a continuous power supply to retain information. Most non-volatile memories use solid-state memory devices as memory elements.

Since the 1960s, a large body of literature has evolved that describes switching and memory effects in metal-insulator-metal structures with thin insulators. One of the seminal works was "New Conduction and Reversible Memory Phenomena in Thin Insulating Films" by J. G. Simmons and R. R. Verderber in 301 Proc. Roy. Soc. 77-102 (1967), incorporated herein by reference for all purposes. Although the mechanisms described by Simmons and Verderber have since been cast into doubt, their contribution to the field is great.

However, nobody has successfully implemented a metal-insulator-metal structure into a commercial solid-state memory device. In the text "Oxides and Oxide Films," volume 6, edited by A. K. Vijh (Marcel Drekker 1981) 251-325, incorporated herein by reference for all purposes, chapter 4, written by David P. Oxley, is entirely devoted to "Memory Effects in Oxide Films." In that text, Oxley says "It is perhaps saddening to have to record that, even after 10 years of effort, the number of applications for these oxide switches is so limited." He goes on to describe a "need for caution before any application is envisaged. This caution can only be exercised when the physics of the switching action is understood; this, in turn, must await a full knowledge of the transport mechanisms operating in any switch for which a commercial use is envisaged."

In 2002, over twenty years after writing that chapter, Oxley revisited the subject in "The Electroformed metal-insulator-metal structure: A comprehensive model" by R. E. Thurstans and D. P. Oxley 35 J. Phys. D. Appl. Phys. 802-809, incorporated herein by reference for all purposes. In that article, the authors describe a model that identifies the conduction process as "trap-controlled and thermally activated tunneling between metal islands produced in the forming process." "Forming" (or "electroforming") is described as "the localized filamentary movement of metallic anode material through the dielectric, induced by the electric field. Here it is important to note that the evaporated dielectric may contain voids and departures from stoichiometry. When resulting filaments through the dielectric carry sufficient current, they rupture to leave a metal island structure embedded in the dielectric. Electronic conduction is possible through this structure by activating tunneling."

However, the authors caution, "The forming process is complex and inherently variable. Also tunneling barriers are susceptible to changes in their characteristics when exposed to water vapour, organic species and oxygen.... Thus, device characteristics can never be expected to be produced consistently or be stable over long periods without passivation, effective encapsulation and a better understanding of the dynamics of the forming process."

In seemingly unrelated research, certain conductive metal oxides (CMOs), have been identified as exhibiting a memory effect after being exposed to an electronic pulse. U.S. Pat. No. 6,204,139, issued Mar. 20, 2001 to Liu et al., incorporated herein by reference for all purposes, describes some perovskite materials that exhibit memory characteristics. The perovskite materials are also described by the same researchers in "Electric-pulse-induced reversible resistance change effect in magnetoresistive films," Applied Physics Letters, Vol. 76, No. 19, 8 May 2000, and "A New Concept for Non-Volatile Memory: The Electric-Pulse Induced Resistive Change Effect in Colossal Magnetoresistive Thin Films," in materials for the 2001 Non-Volatile Memory Technology Symposium, all of which are hereby incorporated by reference for all purposes.

In U.S. Pat. No. 6,531,371 entitled "Electrically programmable resistance cross point memory" by Hsu et al, incorporated herein by reference for all purposes, resistive cross point memory devices are disclosed along with methods of manufacture and use. The memory device comprises an active layer of perovskite material interposed between upper electrodes and lower electrodes.

Similarly, the IBM Zurich Research Center has also published three technical papers that discuss the use of metal oxide material for memory applications: "Reproducible switching effect in thin oxide films for memory applications," Applied Physics Letters, Vol. 77, No. 1, 3 Jul. 2000, "Current-driven insulator-conductor transition and nonvolatile memory in chromium-doped $SrTiO_3$ single crystals," Applied Physics Letters, Vol. 78, No. 23, 4 Jun. 2001, and "Electric current distribution across a metal-insulator-metal structure during bistable switching," Journal of Applied Physics, Vol. 90, No. 6, 15 Sep. 2001, all of which are hereby incorporated by reference for all purposes.

There are continuing efforts to incorporate solid state memory devices into a commercial non-volatile RAM.

BRIEF DESCRIPTION OF THE DRAWINGS

The invention may best be understood by reference to the following description taken in conjunction with the accompanying drawings, in which.

It is to be understood that, in the drawings, like reference numerals designate like structural elements. Also, it is understood that the depictions in the FIGs. are not necessarily to scale.

DETAILED DESCRIPTION OF THE PREFERRED EMBODIMENTS

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessarily obscuring the present invention.

The Memory Array

Conventional nonvolatile memory requires three terminal MOSFET-based devices. The layout of such devices is not ideal, usually requiring an area of at least $8f^2$ for each memory cell, where f is the minimum feature size. However, not all memory elements require three terminals. If, for example, a memory element is capable of changing its electrical properties (e.g., resistivity) in response to a voltage pulse, only two terminals are required. With only two terminals, a cross point array layout that allows a single cell to be fabricated to a size of $4f^2$ can be utilized.

Figure 1A:
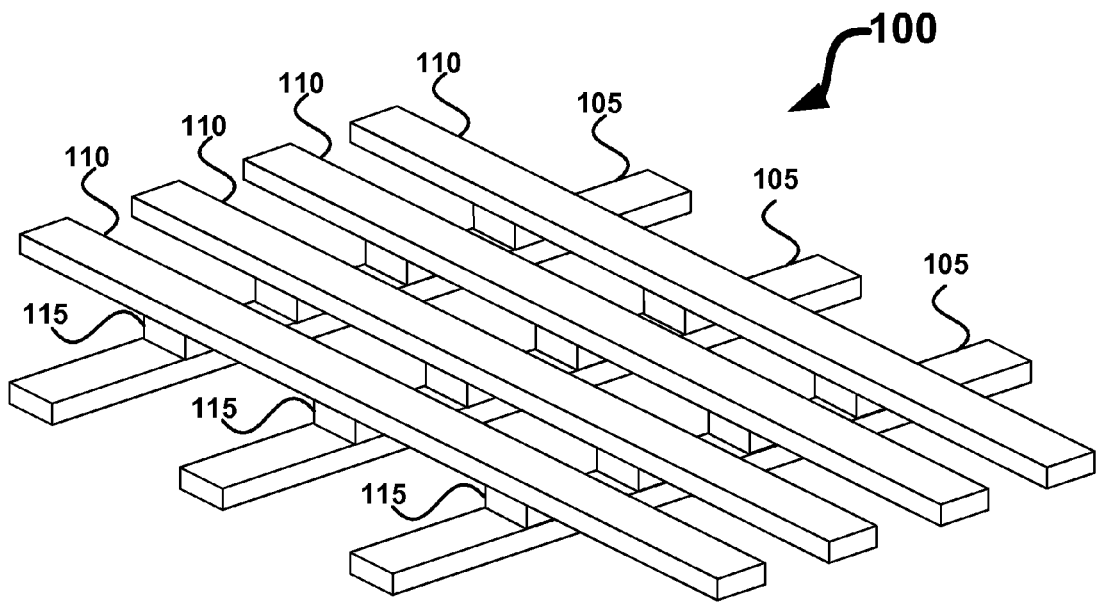
FIG. 1A depicts a perspective view of an exemplary cross point memory array employing a single layer of memory.

FIG. 1A depicts a perspective view of an exemplary cross point memory array 100 employing a single layer of memory. A bottom layer of x-direction conductive array lines 105 is orthogonal to a top layer of y-direction conductive array lines 110. The x-direction conductive array lines 105 act as a first terminal and the y-direction conductive array lines 110 act as a second terminal to a plurality of memory plugs 115, which are located at the intersections of the conductive array lines 105 and 110. The conductive array lines 105 and 110 are used to both deliver a voltage pulse to the memory plugs 115 and carry current through the memory plugs 115 in order to determine their resistive states.

Conductive array line layers 105 and 110 can generally be constructed of any conductive material, such as aluminum, copper, tungsten or certain ceramics. Depending upon the material, a conductive array line would typically cross between 64 and 8192 perpendicular conductive array lines. Fabrication techniques, feature size and resistivity of material may allow for shorter or longer lines. Although the x-direction and y-direction conductive array lines can be of equal lengths (forming a square cross point array) they can also be of unequal lengths (forming a rectangular cross point array), which may be useful if they are made from different materials with different resistivities.

Figure 2A:
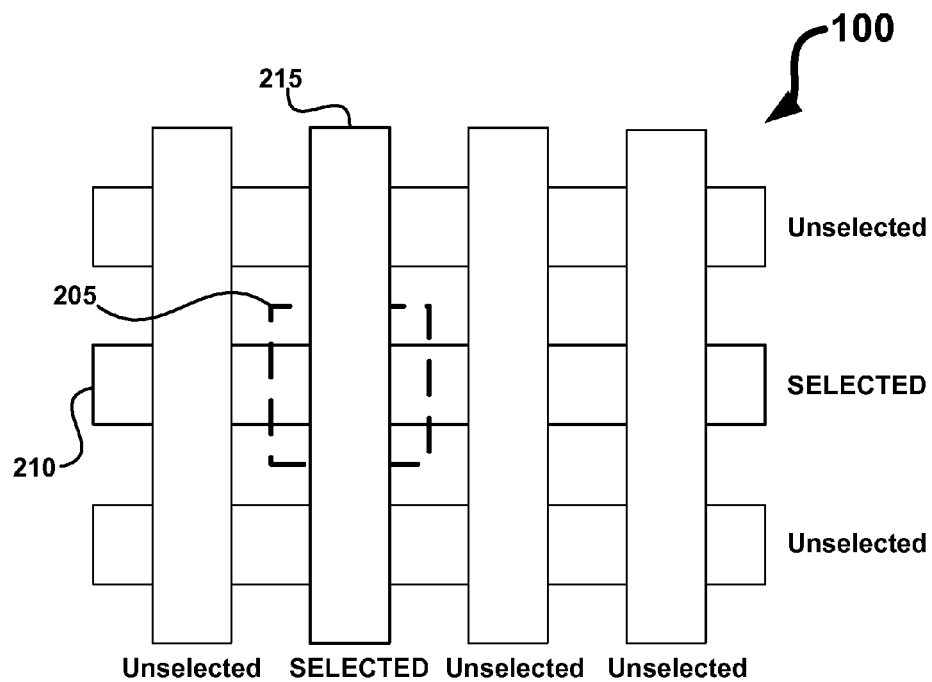
FIG. 2A depicts a plan view of selection of a memory cell in the cross point array depicted in FIG. 1A.
Figure 2B:
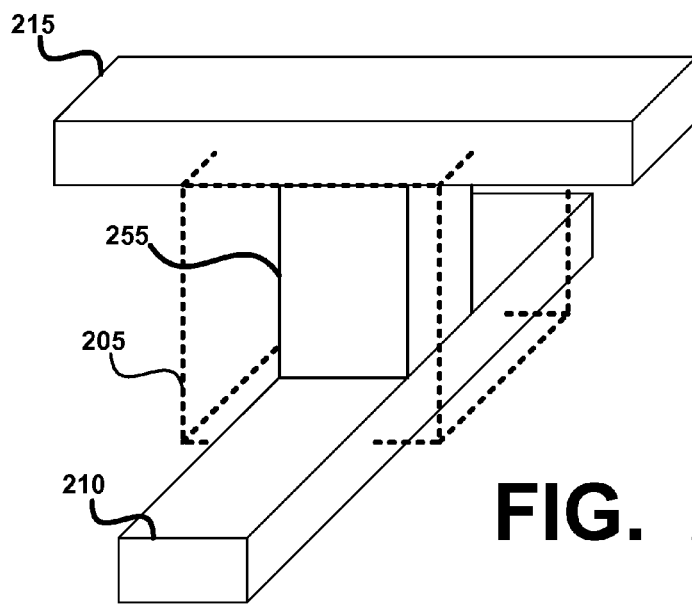
FIG. 2B depicts a perspective view of the boundaries of the selected memory cell depicted in FIG. 2A.

FIG. 2A illustrates selection of a memory cell 205 in the cross point array 100. The point of intersection between a single x-direction conductive array line 210 and a single y-direction conductive array line 215 uniquely identifies the single memory cell 205. FIG. 2B illustrates the boundaries of the selected memory cell 205. The memory cell is a repeatable unit that can be theoretically extended in one, two or even three dimensions. One method of repeating the memory cells in the z-direction (orthogonal to the x-y plane) is to use both the bottom and top surfaces of conductive array lines 105 and 110, creating a stacked cross point array.

Figure 1B:
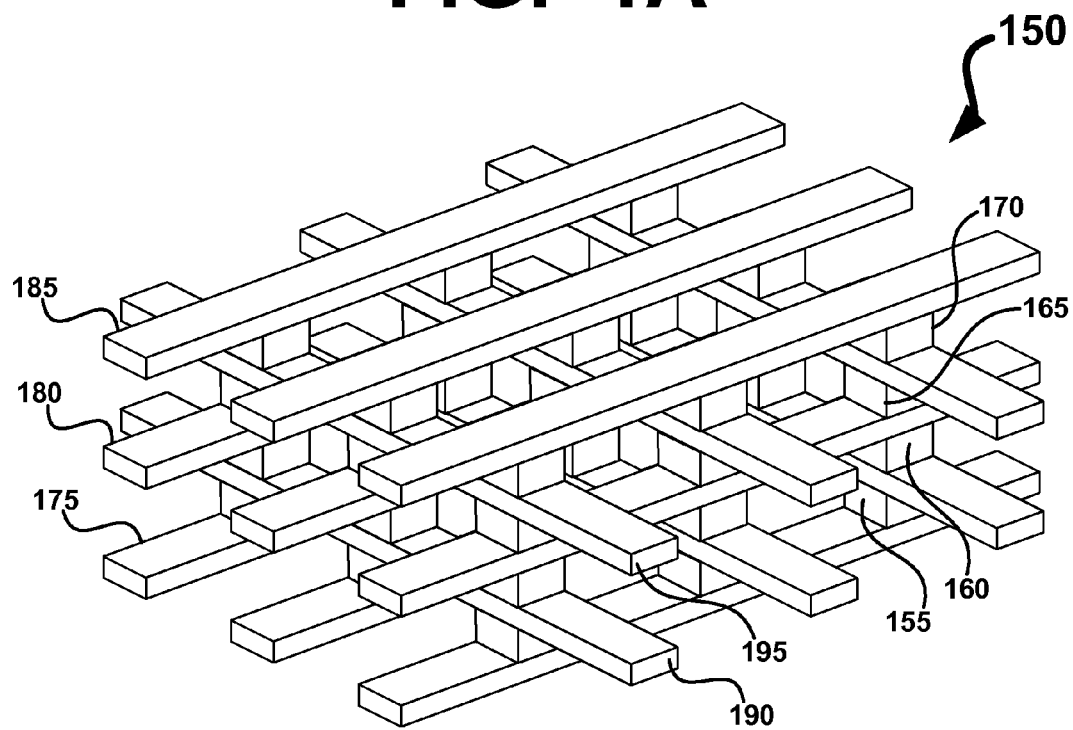
FIG. 1B depicts a perspective view of an exemplary stacked cross point memory array employing four layer of memory.

FIG. 1B depicts an exemplary stacked cross point array 150 employing four memory layers 155, 160, 165, and 170. The memory layers are sandwiched between alternating layers of x-direction conductive array lines 175, 180 and 185 and y-direction conductive array lines 190 and 195 such that each memory layer 155, 160, 165, and 170 is associated with only one x-direction conductive array line layer and one y-direction conductive array line layer. Although the top conductive array line layer 185 and bottom conductive array line layer 175 are only used to supply voltage to a single memory layer 155 and 170, the other conductive array line layers 180, 190, and 195 can be used to supply voltage to both a top and a bottom memory layer 155, 160, 165, or 170.

Referring back to FIG. 2B, the repeatable cell that makes up the cross point array 100 can be considered to be a memory plug 255, plus ½ of the space around the memory plug, plus ½ of an x-direction conductive array line 210 and ½ of a y-direction conductive array line 215. Of course, ½ of a conductive array line is merely a theoretical construct, since a conductive array line would generally be fabricated to the same width, regardless of whether one or both surfaces of the conductive array line was used. Accordingly, the very top and very bottom layers of conductive array lines (which use only one surface) would typically be fabricated to the same size as all other layers of conductive array lines.

One benefit of the cross point array is that the active circuitry that drives the cross point array 100 or 150 can be placed beneath the cross point array, therefore reducing the footprint required on a semiconductor substrate. However, the cross point array is not the only type of memory array that can be used with a two-terminal memory element. For example, a two-dimensional transistor memory array can incorporate a two-terminal memory element. While the memory element in such an array would be a two-terminal device, the entire memory cell would be a three-terminal device.

Figure 3:
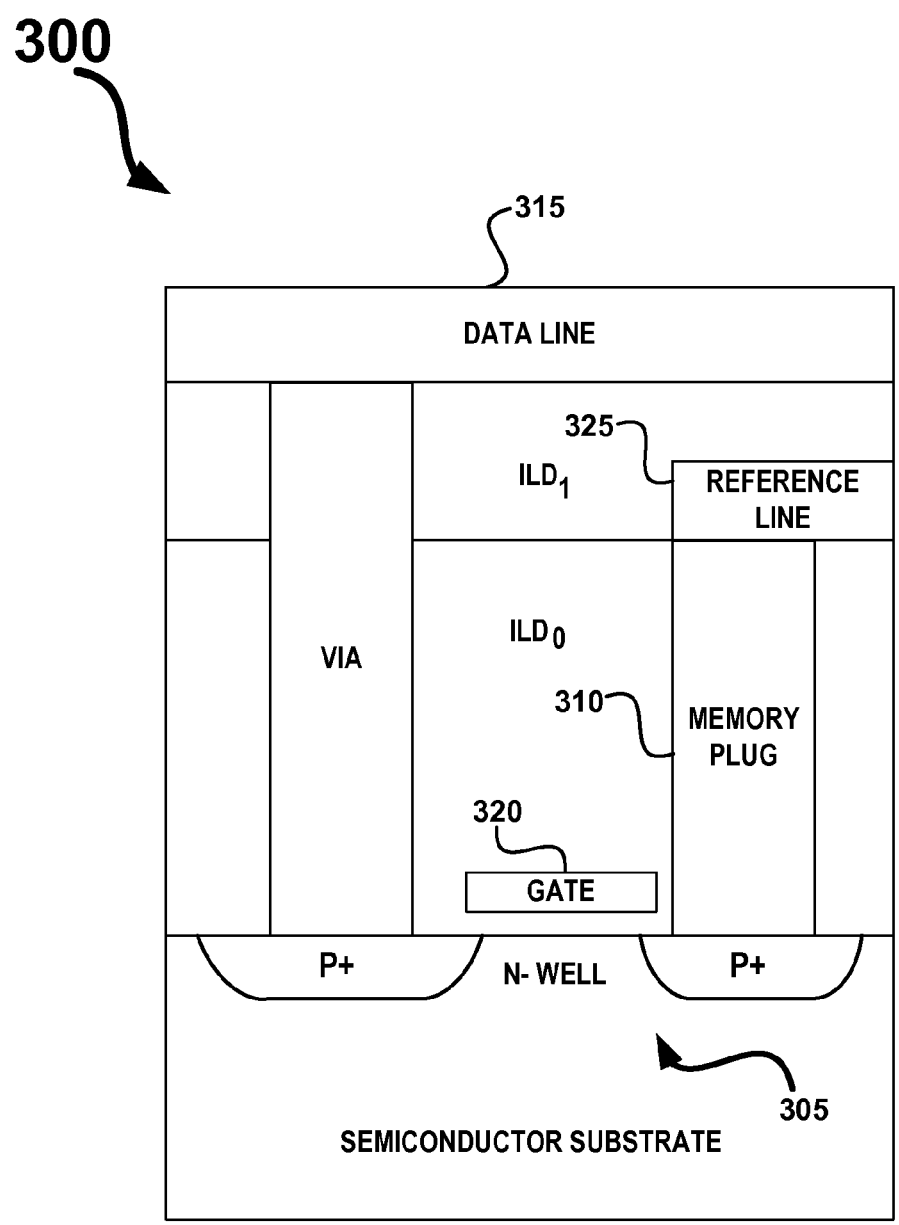
FIG. 3 depicts a generalized cross-sectional representation of a memory cell that can be used in a transistor memory array.

FIG. 3 is a generalized diagrammatic representation of a memory cell 300 that can be used in a transistor memory array. Each memory cell 300 includes a transistor 305 and a memory plug 310. The transistor 305 is used to permit current from the data line 315 to access the memory plug 310 when an appropriate voltage is applied to the select line 320, which is also the transistor's gate. The reference line 325 might span two cells if the adjacent cells are laid out as the mirror images of each other.

Memory Chip Configuration

Figure 4A:
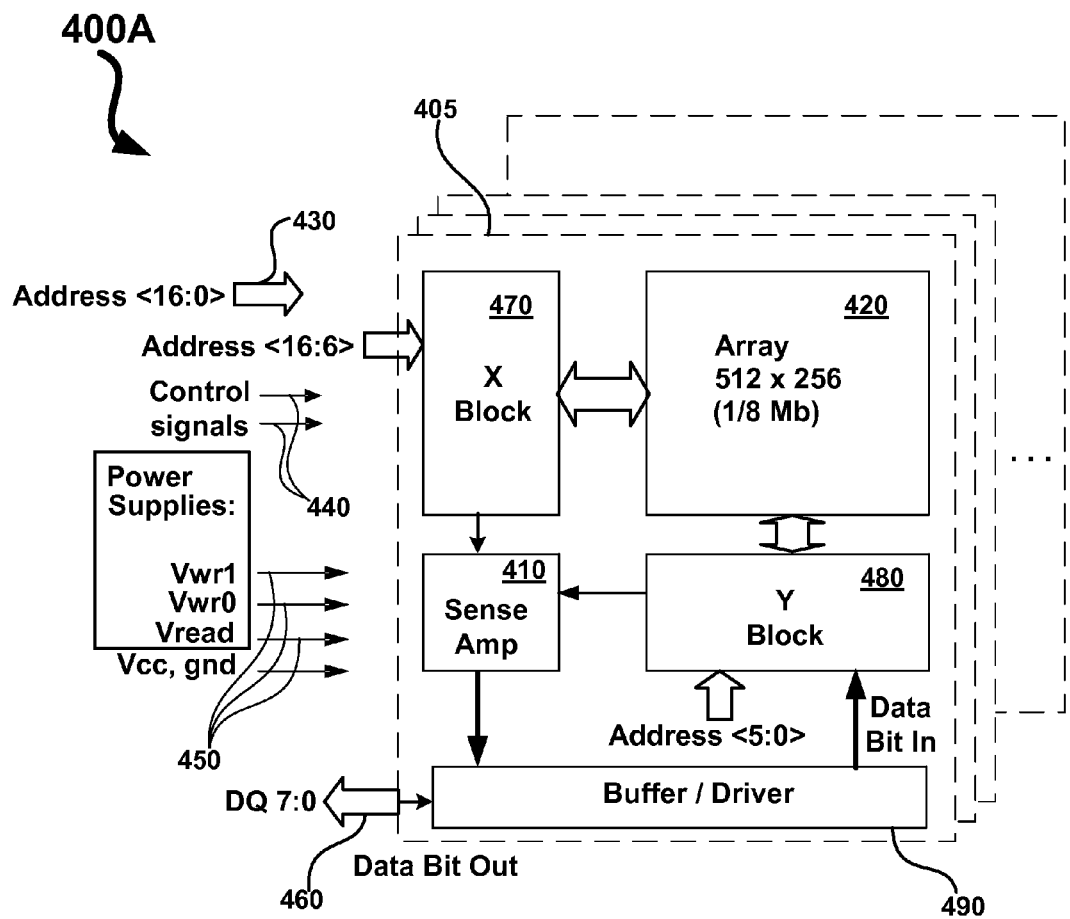
FIG. 4A depicts a block diagram of a representative implementation of an exemplary 1 MB memory.

FIG. 4A is a block diagram of a representative implementation of an exemplary 1 MB memory 400A. Physical layouts might differ, but each memory bit block 405 can be formed on a separate portion of a semiconductor substrate. Input signals into the memory 400A can include an address bus 430, a control bus 440, some power supplies 450 (typically Vcc and ground—the other signals of bus 450 can be internally generated by the 1 MB memory 400A), and a data bus 460. The control bus 440 typically includes signals to select the chip, to signal whether a read or write operation should be performed, and to enable the output buffers when the chip is in read mode. The address bus 430 specifies which location in the memory array is accessed—some addresses going to the X block 470 (typically including a predecoder and an X-decoder) to select one line out of the horizontal array lines. The other addresses go to a Y block 480 (typically including a predecoder and a Y-decoder) to apply the appropriate voltage on specific vertical lines. Each memory bit block 405 operates on one line of the memory chip data bus 460.

The reading of data from a memory array 420 is relatively straightforward: an x-line is energized, and current is sensed by the sensing circuits 410 on the energized y-lines and converted to bits of information.

Figure 4B:
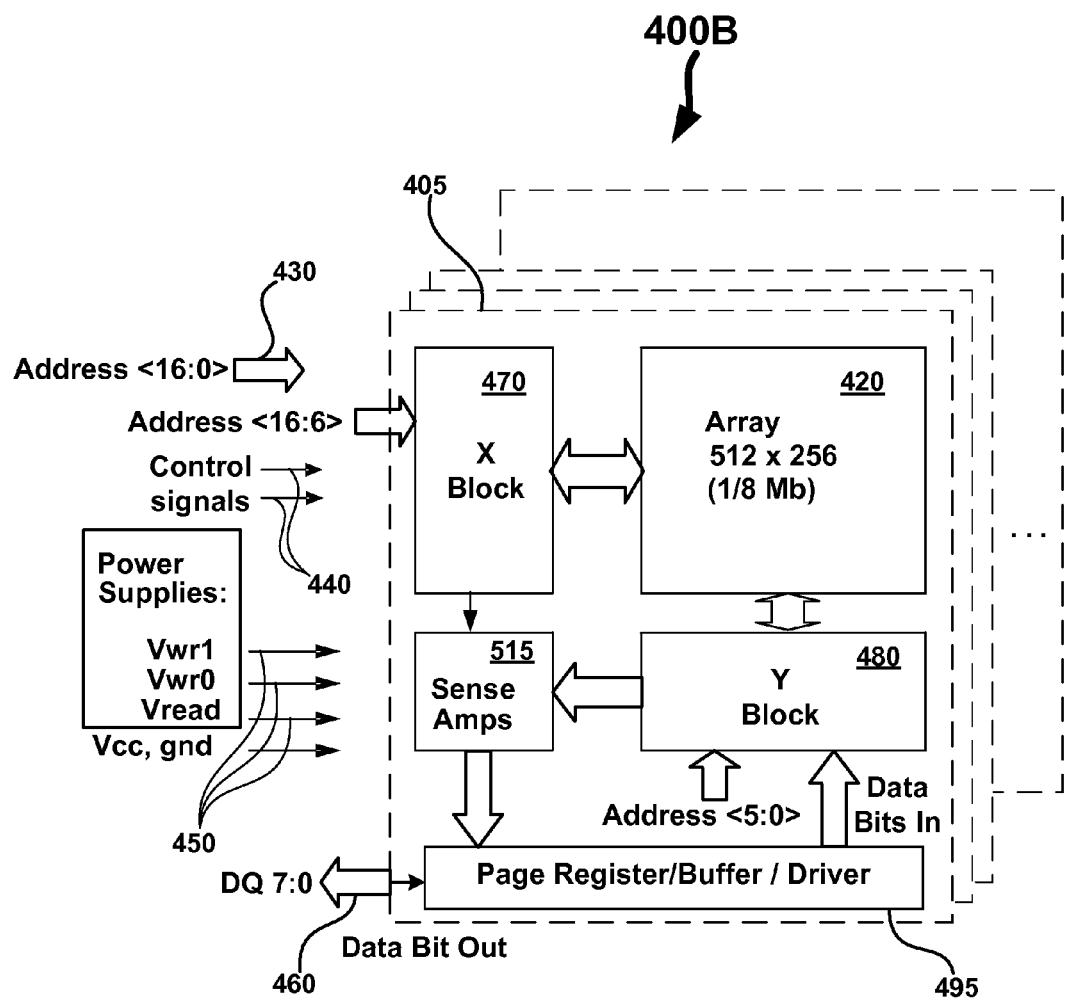
FIG. 4B depicts a block diagram of an exemplary memory that includes sensing circuits that are capable of reading multiple bits.

FIG. 4B is a block diagram of an exemplary memory 400B that includes sensing circuits 415 that are capable of reading multiple bits. The simultaneous reading of multiple bits involves sensing current from multiple y-lines simultaneously.

During a write operation, the data is applied from the data bus 460 to the input buffers and data drivers 490 to the selected vertical lines, or bit lines. Specifically, when binary information is sent to the memory chip 400B, it is typically stored in latch circuits within the circuits 495. Within the circuits 495, each y-line can either have an associated driver circuit or a group of y-lines can share a single driver circuit if the non-selected lines in the group do not cause the unselected memory plugs to experience any change in resistance, typically by holding the non-selected lines to a constant voltage. As an example, there may be 1024 y-lines in a cross point array, and the page register may include 8 latches, in which case the y-block would decode 1 out of 128 y-lines and connect the selected lines to block 495. The driver circuit then writes the 1 or 0 to the appropriate memory plug. The writing can be performed in multiple cycles. In a scheme described in PCT Patent Application No. PCT/US04/13836, filed May 3, 2004, incorporated herein by reference, all the 1s can be written during a first cycle and all the 0s can be written during a second cycle. As described below, certain memory plugs can have multiple stable distinct resistive states. With such multi-level resistance memory plugs, driver circuits could program, for example, states of 00, 01, 10 or 11 by varying write voltage magnitude or pulse length.

It is to be noted that such an architecture can be expanded to create a memory where one array handles all the bits of the data bus, as opposed to having multiple arrays, or memory bit blocks as described above. For example, if the data bus, or memory data organization, also called data width, is 16-bit wide, the y-block of one cross point array can be made to decode 16 lines simultaneously. By applying the techniques of simultaneous reads and 2-cycle writes, such a memory chip with only one array can read and program 16-bit words.

Memory Plug

Each memory plug contains layers of materials that may be desirable for fabrication or functionality. For example, a non-ohmic characteristic that exhibit a very high resistance regime for a certain range of voltages ($V_{NO-}$ to $V_{NO+}$) and a very low resistance regime for voltages above and below that range might be desirable. In a cross point array, a non-ohmic characteristic could prevent leakage during reads and writes if half of both voltages were within the range of voltages $V_{NO-}$ to $V_{NO+}$. If each conductive array line carried ½ $V_W$, the current path would be the memory plug at the intersection of the two conductive array lines that each carried ½ $V_W$. The other memory plugs would exhibit such high resistances from the non-ohmic characteristic that current would not flow through the half-selected plugs.

A non-ohmic device might be used to cause the memory plug to exhibit a non-linear resistive characteristic. Exemplary non-ohmic devices include three-film metal-insulator-metal (MIM) structures and back-to-back diodes in series. Separate non-ohmic devices, however, may not be necessary. Certain fabrications of the memory plug can cause a non-ohmic characteristic to be imparted to the memory cell. While a non-ohmic characteristic might be desirable in certain arrays, it may not be required in other arrays.

Electrodes will typically be desirable components of the memory plugs, a pair of electrodes sandwiching the memory element. If the only purpose of the electrodes is as a barrier to prevent metal inter-diffusion, then a thin layer of non-reactive metal, e.g. TiN, TaN, Pt, Au, and certain metal oxides could be used. However, electrodes may provide advantages beyond simply acting as a metal inter-diffusion barrier. Electrodes (formed either with a single layer or multiple layers) can perform various functions, including to: prevent the diffusion of metals, oxygen, hydrogen and water; act as a seed layer in order to form a good lattice match with other layers; act as adhesion layers; reduce stress caused by uneven coefficients of thermal expansion; and provide other benefits. Additionally, the choice of electrode layers can affect the memory effect properties of the memory plug and become part of the memory element.

The "memory element electrodes" are the electrodes (or, in certain circumstances, the portion of the conductive array lines) that the memory elements are sandwiched in-between. As used herein, memory element electrodes are what allow other components to be electrically connected to the memory element. It should be noted that both cross point arrays and transistor memory arrays have exactly two memory element electrodes since the memory plug has exactly two terminals, regardless of how many terminals the memory cell has. Those skilled in the art will appreciate that a floating gate transistor, if used as a memory element, would have exactly three memory element electrodes (source, drain and gate).

Memory Effect

The memory effect is a hysteresis that exhibits a resistive state change upon application of a voltage while allowing non-destructive reads. A non-destructive read means that the read operation has no effect on the resistive state of the memory element. Measuring the resistance of a memory cell is generally accomplished by detecting either current after the memory cell is held to a known voltage, or voltage after a known current flows through the memory cell. Therefore, a memory cell that is placed in a high resistive state $R_0$ upon application of $-V_W$ and a low resistive state $R_1$ upon application of $+V_W$ should be unaffected by a read operation performed at $-V_R$ or $+V_R$. In such materials a write operation is not necessary after a read operation. It should be appreciated that the magnitude of $|-V_R|$ does not necessarily equal the magnitude of $|+V_R|$.

Furthermore, it is possible to have a memory cell that can be switched between resistive states with voltages of the same polarity. For example, in the paper "The Electroformed metal-insulator-metal structure: a comprehensive model," already incorporated by reference, Thurstans and Oxley describe a memory that maintains a low resistive state until a certain $V_P$ is reached. After $V_P$ is reached the resistive state can be increased with voltages. After programming, the high resistive state is then maintained until a $V_T$ is reached. The $V_T$ is sensitive to speed at which the program voltage is removed from the memory cell. In such a system, programming $R_1$ would be accomplished with a voltage pulse of $V_P$, programming $R_0$ would be accomplished with a voltage pulse greater than $V_P$, and reads would occur with a voltages below $V_T$. Intermediate resistive states (for multi-level memory cells) are also possible.

The $R_1$ state of the memory plug may have a best value of 10 kΩ to 100 kΩ. If the $R_1$ state resistance is much less than 10 kΩ, the current consumption will be increased because the cell current is high, and the parasitic resistances will have a larger effect. If the $R_1$ state value is much above 100 kΩ, the RC delays will increase access time. However, workable single state resistive values may also be achieved with resistances from 5 kΩ to 1 MΩ and beyond with appropriate architectural improvements. Typically, a single state memory would have the operational resistances of $R_0$ and $R_1$ separated by a factor of 10.

Since memory plugs can be placed into several different resistive states, multi-bit resistive memory cells are possible. Changes in the resistive property of the memory plugs that are greater than a factor of 10 might be desirable in multi-bit resistive memory cells. For example, the memory plug might have a high resistive state of $R_{00}$, a medium-high resistive state of $R_{01}$, a medium-low resistive state of $R_{10}$ and a low resistive state of $R_{11}$. Since multi-bit memories typically have access times longer than single-bit memories, using a factor greater than a 10 times change in resistance from $R_{11}$ to $R_{00}$ is one way to make a multi-bit memory as fast as a single-bit memory. For example, a memory cell that is capable of storing two bits might have the low resistive state be separated from the high resistive state by a factor of 100. A memory cell that is capable of storing three or four bits of information might require the low resistive state be separated from the high resistive state by a factor of 1000.

Creating the Memory Effect with Tunneling

Tunneling is a process whereby electrons pass through a bather in the presence of an electric field. Tunneling is exponentially dependant on a barrier's width and the square root of its height. Barrier height is typically defined as the potential difference between the Fermi energy of a first conducting material and the band edge of a second insulating material. The Fermi energy is that energy at which the probability of occupation of an electron state is 50%. Barrier width is the physical thickness of the insulating material.

The barrier height might be modified if carriers or ions are introduced into the second material, creating an additional electric field. A barrier's width can be changed if the barrier physically changes shape, either growing or shrinking. In the presence of a high electric field, both mechanisms could result in a change in conductivity.

Although the following discussion focuses mainly on purposefully modifying the barrier width, those skilled in the art will appreciate that other mechanisms can be present, including but not limited to: barrier height modification, carrier charge trapping space-charge limited currents, thermionic emission limited conduction, and/or electrothermal Poole-Frenkel emission.

Figure 5A:
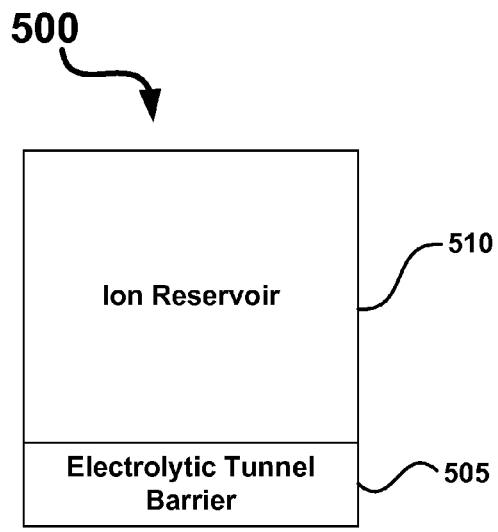
FIG. 5A depicts a block diagram representing the basic components of one embodiment of a memory element.
Figure 5B:
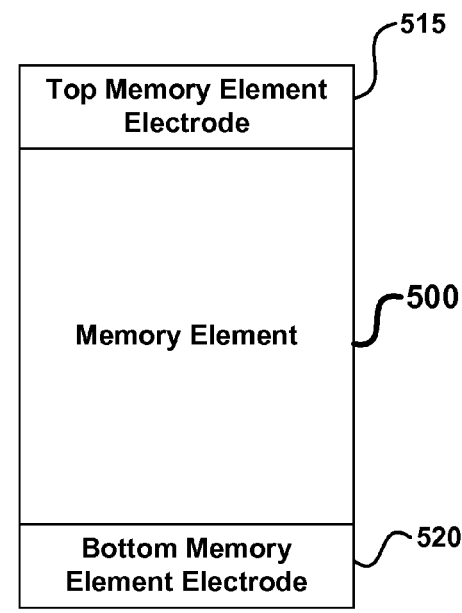
FIG. 5B depicts a block diagram of the memory element of FIG. 5A in a two-terminal memory cell.
Figure 5C:
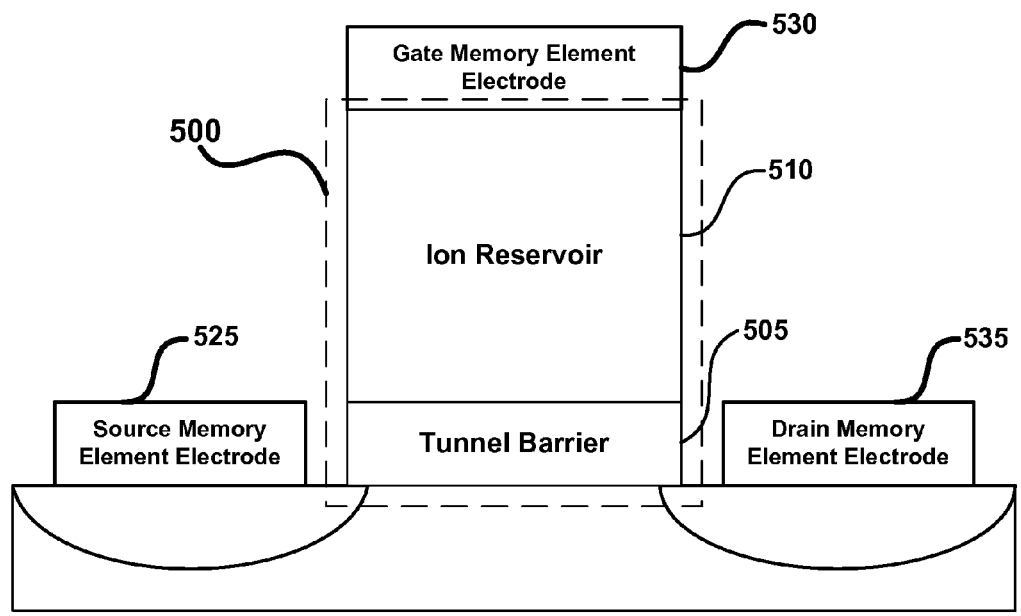
FIG. 5C depicts a block diagram of the memory element of FIG. 5A in a three-terminal memory cell.

FIG. 5A is a block diagram representing the basic components of one embodiment of a memory element 500, FIG. 5B is a block diagram of the memory element 500 in a two-terminal memory cell, and FIG. 5C is a block diagram of the memory element embodiment of FIG. 5A in a three-terminal memory cell.

FIG. 5A shows an electrolytic tunnel barrier 505 and an ion reservoir 510, two basic components of the memory element 500. FIG. 5B shows the memory element 500 between a top memory electrode 515 and a bottom memory electrode 520. The orientation of the memory element (i.e., whether the electrolytic tunnel barrier 505 is near the top memory electrode 515 or the bottom memory electrode 520) may be important for processing considerations, including the necessity of seed layers and how the tunnel barrier reacts with the ion reservoir 510 during deposition. FIG. 5C shows the memory element 500 oriented with the electrolytic tunnel barrier 505 on the bottom in a three-terminal transistor device, having a source memory element electrode 525, gate memory element electrode 530 and a drain memory element electrode 535. In such an orientation, the electrolytic tunnel barrier 505 could also function as a gate oxide.

Referring back to FIG. 5A, the electrolytic tunnel barrier 505 will typically be between 10 and less than 50 angstroms. If the electrolytic tunnel barrier 505 is much greater than 50 angstroms, then the voltage that is required to create the electric field necessary to move electrons through the memory element 500 via tunneling becomes too high for most electronic devices. Depending on the electrolytic tunnel barrier 505 material, a preferred electrolytic tunnel barrier 505 width might be between 15 and 40 angstroms for circuits where rapid access times (on the order of tens of nanoseconds, typically below 100 ns) in small dimension devices (on the order of hundreds of nanometers) are desired.

Fundamentally, the electrolytic tunnel barrier 505 is an electronic insulator and an ionic electrolyte. As used herein, an electrolyte is any medium that provides an ion transport mechanism between positive and negative electrodes. Materials suitable for some embodiments include various metal oxides such as $Al_2O_3$, $Ta_2O_5$, $HfO_2$ and $ZrO_2$. Some oxides, such as zirconia might be partially or fully stabilized with other oxides, such as CaO, MgO, or $Y_2O_3$, or doped with materials such as scandium.

The electrolytic tunnel barrier 505 will typically be of very high quality, being as uniform as possible to allow for predictability in the voltage required to obtain a current through the memory element 500. Although atomic layer deposition and plasma oxidation are examples of methods that can be used to create very high quality tunnel barriers, the parameters of a particular system will dictate its fabrication options. Although tunnel barriers can be obtained by allowing a reactive metal to simply come in contact with an ion reservoir 510, as described in PCT Patent Application No. PCT/US04/13836, filed May 3, 2004, already incorporated herein by reference, such barriers may be lacking in uniformity, which may be important in some embodiments. Accordingly, in a preferred embodiment of the invention the tunnel barrier does not significantly react with the ion reservoir 510 during fabrication.

With standard designs, the electric field at the tunnel barrier 505 is typically high enough to promote tunneling at thicknesses between 10 and 50 angstroms. The electric field is typically higher than at other points in the memory element 500 because of the relatively high serial electronic resistance of the electrolytic tunnel barrier 505. The high electric field of the electrolytic tunnel barrier 505 also penetrates into the ion reservoir 510 at least one Debye length. The Debye length can be defined as the distance which a local electric field affects distribution of free charge carriers. At an appropriate polarity, the electric field within the ion reservoir 510 causes ions (which can be positively or negatively charged) to move from the ion reservoir 510 through the electrolytic tunnel barrier 505, which is an ionic electrolyte.

The ion reservoir 510 is a material that is conductive enough to allow current to flow and has mobile ions. The ion reservoir 510 can be, for example, an oxygen reservoir with mobile oxygen ions. Oxygen ions are negative in charge, and will flow in the direction opposite of current.

Figures 6A, 6B:
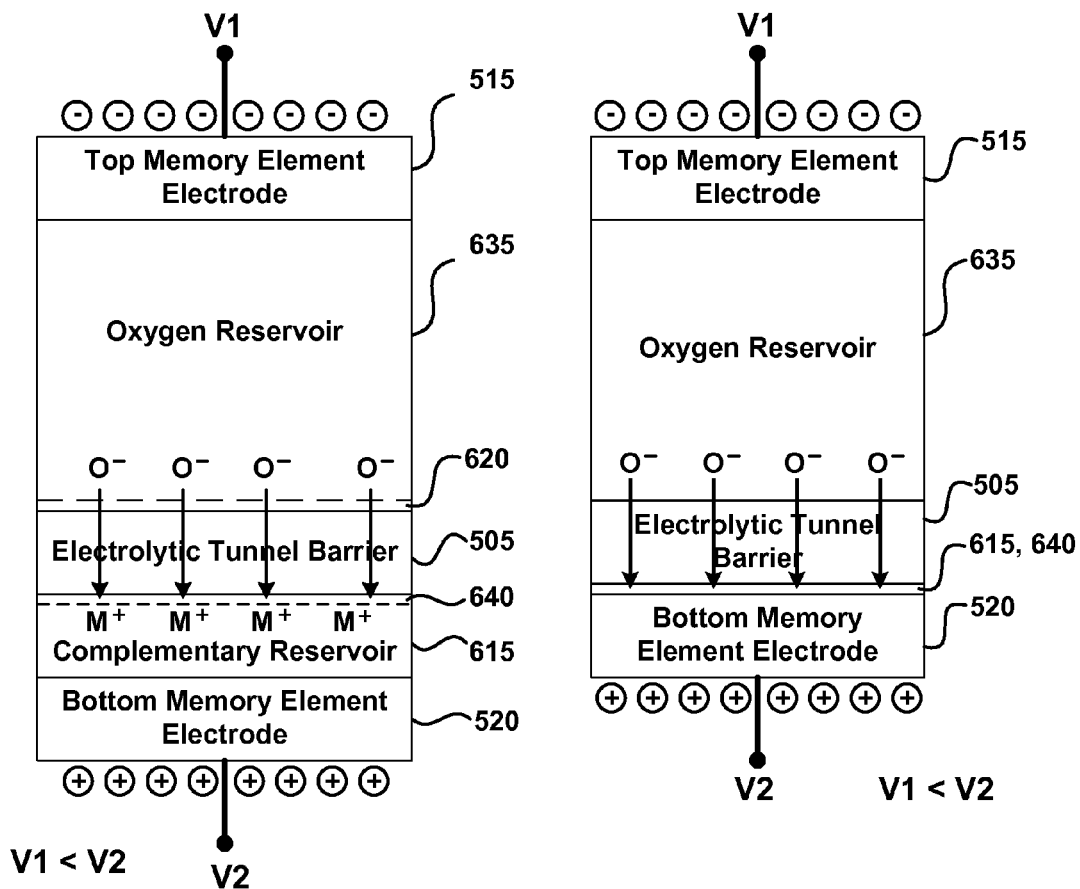
FIG. 6A depicts a block diagram of the memory cell of FIG. 5B where oxygen movement results in a low conductivity oxide.
FIG. 6B depicts a block diagram of the memory cell of FIG. 5B where a low conductivity oxide is self-limiting.

FIG. 6A is a block diagram where a redox reaction between the oxygen reservoir 635 and a complementary reservoir 615 results in a low conductivity oxide 640 and an oxygen-depleted low conductivity region 620. In the case where the ion reservoir 510 is made up of negative oxygen ions, an appropriate complementary reservoir 615 would be positively charged ions. Additionally, the complementary reservoir 615 for the embodiment depicted in FIG. 6A should be conductive in its non-oxidized state and exhibit low conductivity in its oxidized state. Accordingly, many conductive metals (including alkali metals, alkaline earth metals, transition metals and other metals) could act as a complementary reservoir 615. For ease of fabrication, the complimentary reservoir 615 may be the non-oxidized form of the same material that is used for the electrolytic tunnel barrier 505.

When an electric field is applied across the electrolytic tunnel barrier 505, the electric field would penetrate at least one Debye length into the oxygen reservoir 635. The negatively charged oxygen ions migrate through the electrolytic tunnel barrier 505 to combine with positively charged metal ions in the complementary reservoir 615, creating a low conductivity oxide 640. This low conductivity oxide 640 is cumulative with the electrolytic tunnel barrier 505, forcing electrons to tunnel a greater distance to reach the conductive complimentary reservoir 615. Because of the exponential effect of bather width on tunneling, the low conductivity oxide 640 can be just a few angstroms wide and still have a very noticeable effect on the memory element's effective resistance.

Those skilled in the art will appreciate that redox reaction can occur at either the top or bottom surface of the electrolytic tunnel barrier 505. The low conductivity oxide 640 will form at the top of the electrolytic tunnel barrier 505 if the mobility of the complementary ions is greater than the mobility of the oxygen ions through the electrolytic tunnel barrier 505. Conversely, if the mobility of oxygen ions is greater than the mobility of the complementary ions through the electrolytic tunnel barrier 505, then the low conductivity oxide 640 will form at the bottom of the electrolytic tunnel barrier 505.

The stability of metal oxides will depend on its activation energy. Reversing the redox reaction for many metal oxides, such as Hf and Al, requires a great amount of energy, making such high activation energy cells convenient for use as one-time programmable memories. Oxides with low activation energy, such as $RuO_x$ and $CuO_x$, are usually desirable for reprogrammable memories.

One optimization would be to use the polarity that is less sensitive to read disturbs during reads. For write once memory this may be complementary to the write polarity. Alternatively, alternating read polarities can be used. Another optimization for certain embodiments could be to limit the size of the complementary reservoir 615.

FIG. 6B is a block diagram where the complimentary reservoir 615 is fabricated to be self-limiting. Since only a small amount of the complementary reservoir 615 is deposited, the amount of positive ions available to combine with the free oxygen ions is limited. Once all the free ions in the complimentary reservoir 615 are consumed, no more low conductivity oxide 640 could be formed.

In most cases the effective width of the tunneling barrier is limited only by the availability of ions in the reservoirs 615 and 635. Since many different barrier widths can be formed multiple bits per cell can be easily implemented with different resistive states.

Referring back to FIG. 5A, certain ion reservoirs 510 have the physical property of being less conductive in an oxygen-deficient state. Some examples of materials that have mobile oxygen ions and are less conductive in an oxygen-deficient state include certain perovskites (a perovskite generally being in the form of an $ABX_3$ structure, where A has an atomic size of 1.0-1.4 Å and B has an atomic size of 0.45-0.75 Å for the case where X is either oxygen or fluorine) such as $SrRuO_3$ (SRO), $Pr_{0.7}Ca_{0.3}MnO_3$, $Pr_{0.5}Ca_{0.5}MnO_3$ and other PCMOs. Many of these ion reservoirs 510 are potentially mixed valence oxides. For example, PCMO might be more conductive when its manganese ion is in its $Mn^{3+}$ state, but less conductive when its manganese ion is in its $Mn^{4+}$ state.

Accordingly, as shown in FIG. 6A, certain oxygen reservoirs 635 will additionally form an oxygen-depleted low conductivity region 620 that also adds to the memory effect. Those skilled in the art will appreciate that either the oxygen-depleted low conductivity region 620 or the low conductivity oxide 640 may independently be sufficient to create an acceptable memory effect or, if the conduction mechanisms are different (e.g., small polaron hopping through the oxygen-depleted low conductivity region 620 and tunneling through the low conductivity oxide 640) one mechanism may even dominate the overall conduction through the memory element 500. Accordingly, memory cells can be designed to take advantage of only one phenomenon or the other or both.

Creating the Memory Effect with Oxygen Depletion

Figure 7:
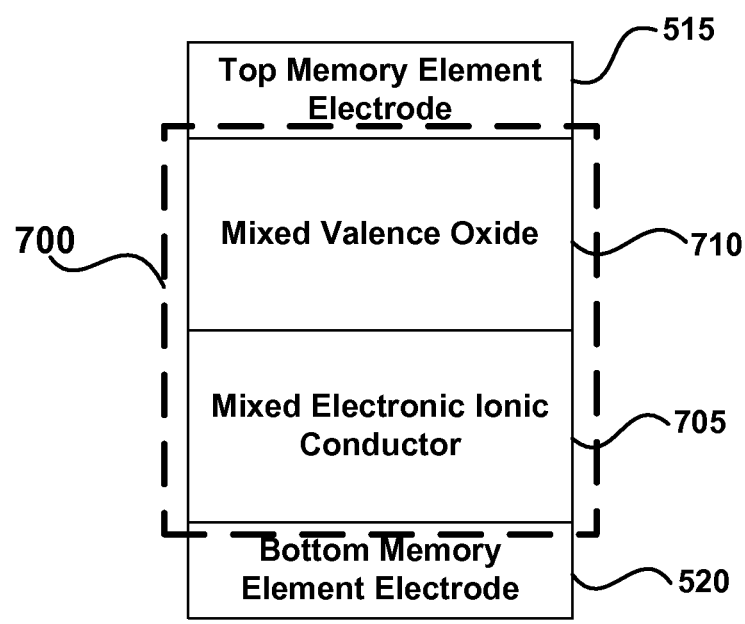
FIG. 7 depicts a block diagram of a two-terminal memory cell using another memory element embodiment.

FIG. 7 is a block diagram representing another embodiment of a memory element 700 in a two-terminal memory cell where an oxygen-depleted low conductivity region in an otherwise conductive material creates the majority of the memory effect. FIG. 7 shows a mixed valence oxide 710 and a mixed electronic ionic conductor 705, two basic components of the memory element 700 between a top memory electrode 515 and a bottom memory electrode 520. As with the embodiment of FIG. 5A, the orientation of the memory element may be important for processing considerations. It should be appreciated that the memory element can also be used in a three-terminal memory cell, similar to what is depicted in FIG. 5C.

In these embodiments, ion deficiency (which, in the embodiment of FIG. 7, is oxygen) will cause an otherwise conductive material to become less conductive. The mixed valence oxide 710 will generally be crystalline, either as a single crystalline structure or a polycrystalline structure. In one specific embodiment the crystalline structure maintains its basic crystallinity (with some degree of deformation) in both valence states. By maintaining its crystallinity, both the physical stresses on the memory element may be reduced and the reversibility of the process may be easier to achieve.

The mixed electronic ionic conductor 705 is similar, and in some cases identical, to the electrolytic tunnel barrier 505 of FIGS. 6A and 6B. Like the electrolytic tunnel barrier 505, the mixed electronic ionic conductor 705 is both an electrolyte and creates a high electric field that promotes ionic movement. However, whether the mixed electronic ionic conductor 705 promotes actual tunneling is not critical.

Figure 8A:
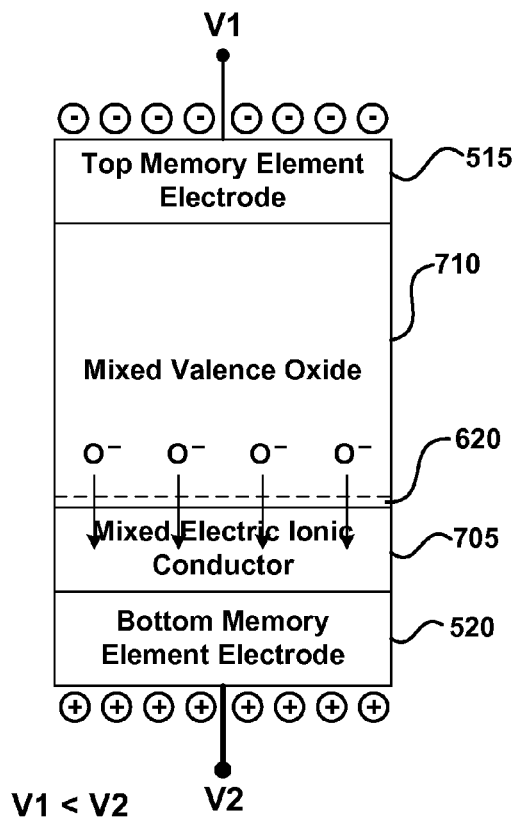
FIG. 8A depicts a block diagram of the memory cell of FIG. 7 where a low conductivity region is created in a mixed valence oxide.
Figure 8B:
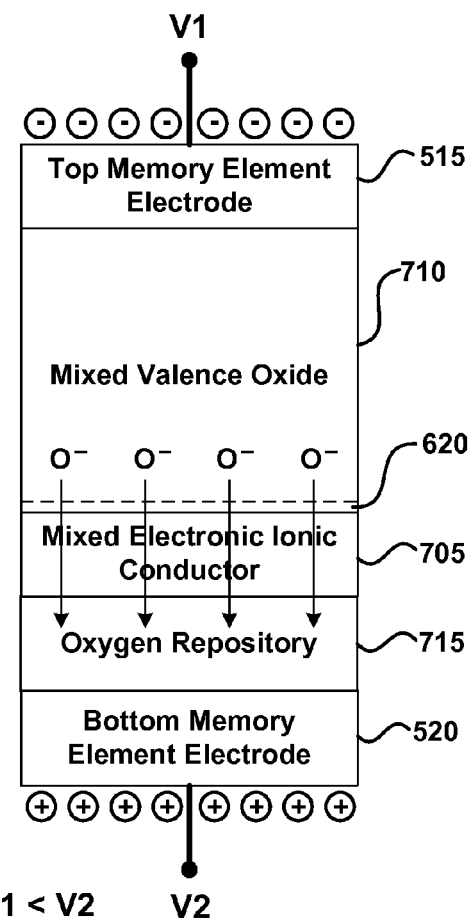
FIG. 8B depicts a block diagram of the memory cell of FIG. 8A that includes an oxygen repository.

In FIG. 8A the mixed electronic ionic conductor 705 also acts as an oxygen repository, temporarily holding oxygen until an opposite polarity voltage pulse pushes the oxygen back into the mixed valence oxide 710. In FIG. 8B a separate oxygen repository 715 layer is used to hold the oxygen. The oxygen repository 715 may be identical to the previously described complementary reservoir 615 or even certain types of oxygen reservoirs 635 such as $IrO_x$. If a redox reaction creates an oxide in the oxygen repository 715, the activation energy required to disassociate the oxygen from the oxide will influence whether the memory is used as a one time programmable memory or a rewritable memory.

In one specific embodiment that is similar to an inverted embodiment of what is shown in FIG. 8A, the bottom electrode 520 might be a 500 Angstrom layer of platinum, DC magnetron sputtered with 180 watts applied to a platinum target in 4 mTorr of argon at 450° C. and then cooled in-situ for at least 10 minutes in the sputter ambient gas environment of 4 mTorr of argon.

The mixed valence oxide 710 might be a 500 Angstrom layer of a PCMO perovskite, RF magnetron sputtered in 10 mTorr of argon at 550° C. by applying 120 watts to a $Pr_{0.7}Ca_{0.3}MnO_3$ target (made with hot isostatic pressing or HIP), afterwards cooled in-situ for 10 minutes in the sputter ambient gas environment of 10 mTorr of argon, then cooled for another 10 minutes in a load lock chamber at 600 Torr of oxygen.

The mixed electronic ionic conductor 705 might be 20 or 30 Angstroms of some type of $AlO_x$, RF magnetron sputtered in 4 mTorr of argon with 1% oxygen at 300° C. by applying 150 watts to an $Al_2O_3$ target (also made with HIP), and then annealed for 30 minutes at 250° C. in the sputter ambient gas environment of 4 mTorr of argon with 1% $O_2$.

If an embodiment similar to FIG. 8B were desired, an oxygen repository 715 of 200 Angstroms of aluminum metal could be DC magnetron sputtered with 250 watts applied to an aluminum target in 4 mTorr of argon at 25° C.

The top electrode 515 might be 500 Angstroms of platinum, DC magnetron sputtered with 180 watts applied to a platinum target in 4 mTorr of argon at 25° C.

CONCLUDING REMARKS

Although the invention has been described in its presently contemplated best mode, it is clear that it is susceptible to numerous modifications, modes of operation and embodiments, all within the ability and skill of those familiar with the art and without exercise of further inventive activity. For example, although the ion reservoir was described as being negative in connection with the oxygen reservoir, a positively charged ion reservoir may have the same functionality, as long as the other physical requirements of the specific embodiments are met. Furthermore, while the theories provided above are one possible explanation of how the various materials interact, the inventors do not wish to be bound by any theoretical explanation. Accordingly, that which is intended to be protected by Letters Patent is set forth in the claims and includes all variations and modifications that fall within the spirit and scope of the claims.

What is claimed is:

1. A method, comprising:
   providing a memory element (ME) including a first ion reservoir having mobile oxygen ions and in contact with a first electrode of a two-terminal switch and a tunnel barrier and a second reservoir in contact with the tunnel barrier and positioned between a second electrode of the two-terminal switch and the tunnel barrier, the second reservoir operative as a repository for the mobile oxygen ions; and
   applying a read voltage across the first and second electrodes, the read voltage operative to generate a read current having a magnitude that is indicative of a present conductivity of the ME, wherein applying the read voltage is non-destructive to the present conductivity of the ME.

2. The method of claim 1, further comprising:
   applying a write voltage across the first and second electrodes, wherein the tunnel barrier promotes a first electric field operative to transport the mobile oxygen ions from the first ion reservoir and into the tunnel barrier while the first write voltage is applied.

3. The method of claim 2, wherein a polarity of the read voltage is different than a polarity of the write voltage.

4. The method of claim 1, wherein the present conductivity is indicative of stored data.

5. The method of claim 4, wherein the stored data is retained in the absence of electrical power.

6. The method of claim 1, wherein the read voltage is applied as a voltage pulse.

7. The method of claim 2, wherein the write voltage is applied a voltage pulse.

8. The method of claim 2, wherein a magnitude of the read voltage is less than a magnitude of the write voltage.

9. The method of claim 8, wherein a polarity of the read voltage is different than a polarity of the write voltage.

10. An apparatus, comprising:
    a first electrode;
    a second electrode; and
    a memory element (ME) positioned between the first and second electrodes, the ME electrically in series with the first and second electrodes, the ME including:
       a first ion reservoir including mobile oxygen ions, the first ion reservoir in contact with the first electrode,
       a tunnel barrier in contact with the first ion reservoir and the second electrode, wherein the tunnel barrier made from a material that is an electrolyte to the mobile oxygen ions and is permeable by the mobile oxygen ions when a first voltage is applied across the first and second electrodes, and the tunnel barrier is electrically in series with the first ion reservoir; and
       a second reservoir in contact with the tunnel barrier and positioned between the second electrode and the tunnel barrier, the second reservoir operative as a repository for the mobile oxygen ions.

11. The apparatus of claim 10, wherein the ME has an electrical conductivity that can be reversibly switched between a first conductivity and a second conductivity that is greater than the first conductivity as a function of mobile oxygen ion migration.

12. The apparatus of claim 10, wherein the mobile oxygen ions in the first ion reservoir are operative to change a conductivity of the first ion reservoir from a relatively high conductivity to a relatively low conductivity when the mobile oxygen ions are transported into the tunnel barrier or from a relatively low conductivity to a relatively high conductivity when the mobile oxygen ions are transported back into the first ion reservoir.

13. The apparatus of claim 10, wherein the first voltage is operative to generate a first electric field in the tunnel barrier and a second electric field in the first ion reservoir, the first electric field having a greater magnitude than the second electric field and the first electric field extending into the first ion reservoir by a distance of at least one Debye length.

14. The apparatus of claim 10, further comprising:
    a line coupled to the first electrode; and
    a component coupled to the line, the component configured to energize the line to apply a second voltage across the across the first and second electrodes, the second voltage operative to generate a read current having a magnitude that is indicative of a present conductivity of the ME, wherein applying the second voltage is non-destructive to the present conductivity of the ME.

15. The apparatus of claim 14, wherein a magnitude of the second voltage is less than a magnitude of the first voltage.

16. The apparatus of claim 14, wherein a polarity of the second voltage is different than a polarity of the first voltage.

17. The apparatus of claim 14, wherein the stored data is retained in the absence of electrical power.

18. The apparatus of claim 14, wherein the present conductivity is indicative of stored data.

19. The apparatus of claim 14, wherein the first voltage is applied as a voltage pulse.

20. The apparatus of claim 14, wherein the second voltage is applied as a voltage pulse.

\* \* \* \* \*